US009250651B2

(12) United States Patent
Cavallaro et al.

(10) Patent No.: US 9,250,651 B2
(45) Date of Patent: Feb. 2, 2016

(54) ELECTRONIC DEVICE WITH FOLDED DISPLAY

(71) Applicant: Google Technology Holdings LLC, Mountain View, CA (US)

(72) Inventors: Alberto R. Cavallaro, Northbrook, IL (US); Adrian G. Manea, Libertyville, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 222 days.

(21) Appl. No.: 13/869,047

(22) Filed: Apr. 24, 2013

(65) Prior Publication Data

US 2014/0321072 A1    Oct. 30, 2014

(51) Int. Cl.
*G06F 1/16* (2006.01)
*H05K 5/00* (2006.01)
*H05K 7/00* (2006.01)
*G06F 3/041* (2006.01)
*G06F 17/00* (2006.01)
*H05K 1/02* (2006.01)
(Continued)

(52) U.S. Cl.
CPC ............ *G06F 1/1601* (2013.01); *G06F 1/1647* (2013.01); *G06F 1/1652* (2013.01); *H04M 1/0268* (2013.01); *H05K 1/028* (2013.01); *H05K 5/0017* (2013.01); *G06F 3/041* (2013.01); *G06T 1/00* (2013.01); *G09G 5/00* (2013.01); *H05K 7/00* (2013.01)

(58) Field of Classification Search
CPC ......... G06F 3/041; G06F 1/1601; G06T 1/00; G09G 5/00; H05K 7/00; H04M 1/00
USPC ................ 345/173, 418; 361/679.01, 679.21; 379/433.12
See application file for complete search history.

(56) References Cited

U.S. PATENT DOCUMENTS 4,807,079 A    2/1989    Takahashi
4,947,235 A    8/1990    Roth et al.
(Continued)

FOREIGN PATENT DOCUMENTS

EP          1150476 A2    10/2001
JP       2005303067 A    10/2005

OTHER PUBLICATIONS

Matthew Humphries, Samsung rolls out curved and flexible displays at CES, http://www.geek.com/mobile/samsung-rolls-out-curved-and-flexible-displays-at-ces-1535429/, Oct. 1, 2013, all pages.
(Continued)

*Primary Examiner* — Courtney Smith
*Assistant Examiner* — Zhengfu Feng

(57) ABSTRACT

An electronic device with folded display (500) is disclosed. The electronic device (500) includes: a housing (502) including a front surface (506), a rear surface (508) and edge surface (510); a flexible display (504); a controller (512) coupled to the housing (502) and flexible display (504), the controller (512) configured to control the operations of an electronic device; and the flexible display (504) extending along the front surface (506) and along at least one edge surface (510), forming a fold area (514) where the front surface (506) and the at least one edge surface (510) meet, such that the flexible display (504) includes multiple display surfaces. Advantageously, this structure can provide an enhanced electronic device with multiple displays and/or user interfaces and is adapted for mass production.

19 Claims, 4 Drawing Sheets

(51) Int. Cl.
*H04M 1/02* (2006.01)
*G06T 1/00* (2006.01)
*G09G 5/00* (2006.01)

(56) References Cited

U.S. PATENT DOCUMENTS

| | | | |
|---|---|---|---|
| 5,031,027 | A | 7/1991 | Dorinski et al. |
| 5,335,800 | A | 8/1994 | Liu |
| 5,352,925 | A | 10/1994 | Sudoh et al. |
| 5,394,304 | A | 2/1995 | Jones |
| 5,398,163 | A | 3/1995 | Sano |
| 5,597,979 | A | 1/1997 | Courtney et al. |
| 5,878,012 | A | 3/1999 | Watanabe et al. |
| 6,172,881 | B1 | 1/2001 | Hirai |
| 6,320,835 | B1 | 11/2001 | Kamei |
| 6,331,850 | B1 | 12/2001 | Olodort et al. |
| 6,452,811 | B1 | 9/2002 | Tracy et al. |
| 6,659,927 | B2 | 12/2003 | Meyers et al. |
| 6,924,989 | B2 | 8/2005 | Hall |
| 6,947,778 | B2 | 9/2005 | Tsai |
| 6,973,186 | B2 * | 12/2005 | Shin ................... 379/433.12 |
| 6,975,889 | B2 | 12/2005 | Chen et al. |
| 7,189,924 | B1 | 3/2007 | Popescu et al. |
| 7,231,039 | B2 | 6/2007 | Gronroos et al. |
| 7,319,892 | B2 | 1/2008 | Kato |
| 7,367,116 | B2 | 5/2008 | Yoshino et al. |
| 7,636,437 | B2 | 12/2009 | Gronroos et al. |
| 2001/0033478 | A1 | 10/2001 | Ortiz et al. |
| 2007/0270193 | A1 | 11/2007 | Hsieh |
| 2010/0156887 | A1 * | 6/2010 | Lindroos et al. ............. 345/418 |
| 2012/0218219 | A1 | 8/2012 | Rappoport et al. |
| 2013/0076612 | A1 | 3/2013 | Myers |
| 2013/0076649 | A1 * | 3/2013 | Myers et al. .................. 345/173 |

OTHER PUBLICATIONS

Flexible AMOLED, Super Slim & Flexible, http://thetechndroid.wordpress.com/2013/01/10/samsung-names-flexible-oled-display-series-youm-shows-new-prototype-handheld-device/ , Feb. 6, 2012, all pages.

International Search Report and Written Opinion for International Application No. PCT/US2014/033408, mailed Jul. 17, 2014, 10 pages.

* cited by examiner

ELECTRONIC DEVICE WITH FOLDED DISPLAY

BACKGROUND

1. Field

The present disclosure relates to an electronic device with a folded display.

2. Introduction

Flexible displays are gaining popularity. Some technologies involved in flexible displays include, for example: liquid crystal displays (LCD), light emitting diodes (LED), Organic LEDs (OLED), Electrophoretic displays (EPD), electronic ink and Gyricon.

Some flexible displays use flexible Organic LED display technology. There is a major interest and desire to commercialize such displays, for many use cases, such as in mobile devices, gaming, the enterprise, tablets, electronic devices, wristwatches and the like.

It is desirable to increase the display area and the number of display surfaces on an electronic device, such as a wireless communication device. Conventional displays are fabricated on glass substrates which shape and integration are limited by the singulation technology and rigidity. For example, if multiple displays are desired a number of independent displays need to be integrated on each desired surface.

There is a need to provide enhanced displays in electronic devices, which are cost effective and can be mass produced, to improve a user's experience.

It would be considered an improvement in the art, if an electronic device with folded display were developed.

BRIEF DESCRIPTION OF THE DRAWINGS

In order to describe the manner in which the above-recited and other advantages and features of the disclosure can be obtained, a more particular description of the disclosure briefly described above will be rendered by reference to specific embodiments thereof which are illustrated in the appended drawings. Understanding that these drawings depict only typical embodiments of the disclosure and are not therefore to be considered to be limiting of its scope, the disclosure will be described and explained with additional specificity and detail through the use of the accompanying drawings in which.

DETAILED DESCRIPTION

Figure 1:
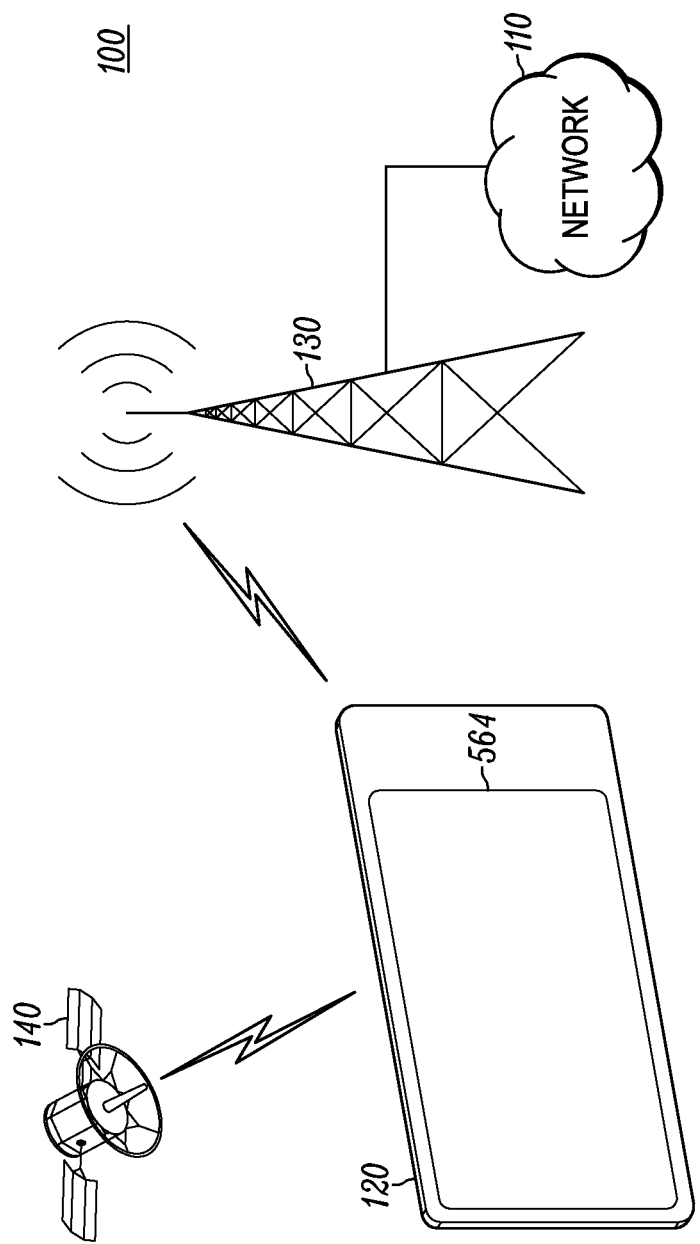
FIG. 1 is an exemplary block diagram of a communication system with an electronic device 120, according to one embodiment.

FIG. 1 is an exemplary block diagram of a system 100 according to one embodiment. The system 100 can include a network 110, a terminal 120, and a base station 130. The terminal 120 may be an electronic device, such as a wireless communication device, such as a wireless telephone, a cellular telephone, a personal digital assistant, a pager, a personal computer, a tablet, a selective call receiver, or any other device that is capable of sending and receiving communication signals on a network including a wireless network. The network 110 may include any type of network that is capable of sending and receiving signals, such as wireless signals. For example, the network 110 may include a wireless telecommunications network, a cellular telephone network, a Time Division Multiple Access (TDMA) network, a Code Division Multiple Access (CDMA) network, Global System for Mobile Communications (GSM), a Third Generation (3G) network, a Fourth Generation (4G) network, a satellite communications network, and other like communications systems. More generally, network 110 may include a Wide Area Network (WAN), a Local Area Network (LAN) and/or a Personal Area Network (PAN). Furthermore, the network 110 may include more than one network and may include a plurality of different types of networks. Thus, the network 110 may include a plurality of data networks, a plurality of telecommunications networks, a combination of data and telecommunications networks and other like communication systems capable of sending and receiving communication signals. In operation, the terminal 120 (also referred to as electronic device 120) can communicate with the network 110 and with other devices on the network 110 by sending and receiving wireless signals via the base station 130, which may also comprise local area, and/or personal area access points. The terminal 120 is shown being in communication with a global positioning system (GPS) 140 satellite, global navigation satellite system (GNSS) or the like, for position sensing and determination.

Figure 2:
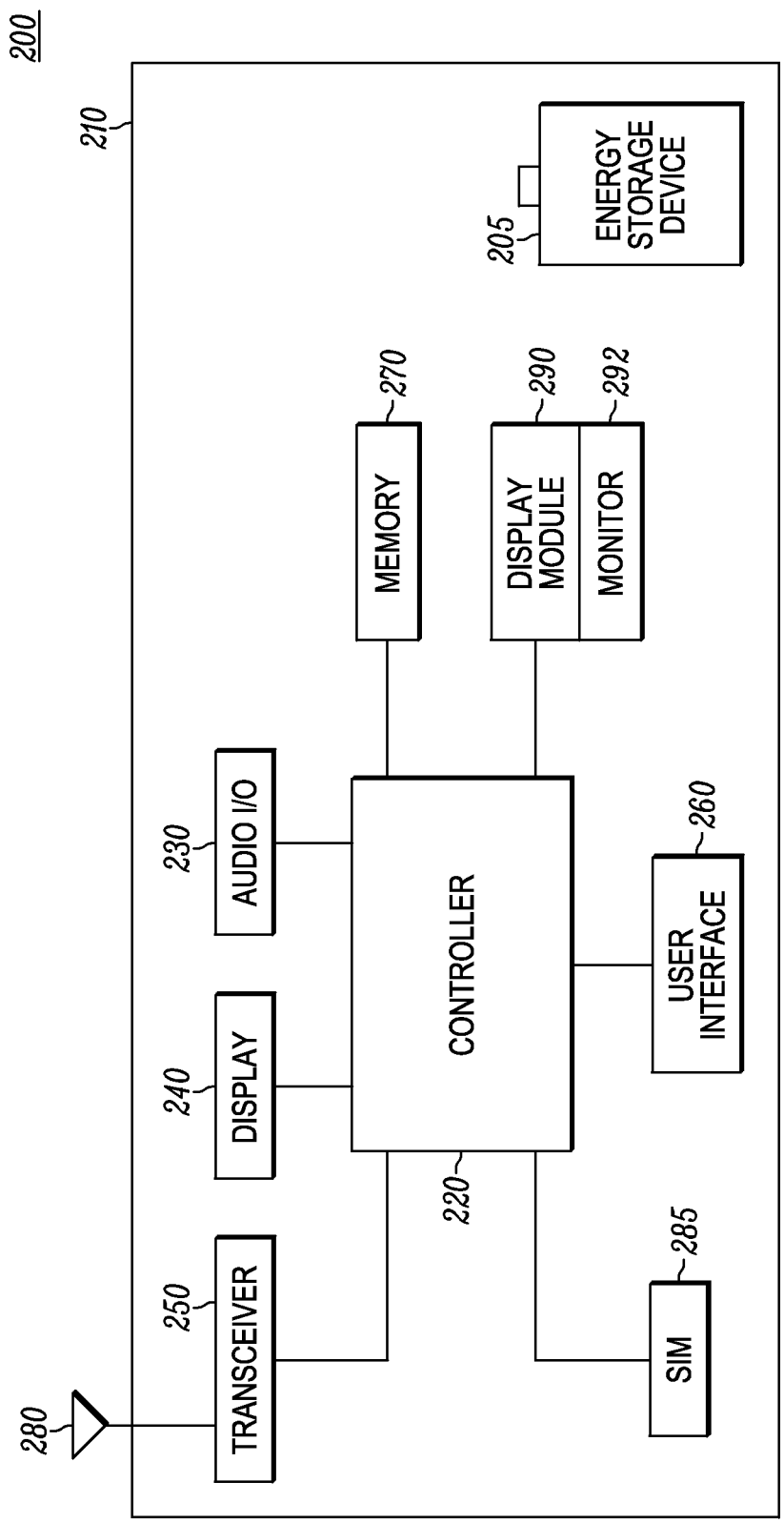
FIG. 2 is an exemplary block diagram of an electronic device with folded display according to one embodiment.

FIG. 2 is an exemplary block diagram of an electronic device or wireless communication device 200, configured with an energy storage device, battery or module 205, such as in the terminal 120, for example. The electronic device or wireless communication device 200 can include a housing 210, a controller 220 coupled to the housing 210, audio input and output circuitry 230 coupled to the housing 210, a display 240 coupled to the housing 210, a transceiver 250 coupled to the housing 210, a user interface 260 coupled to the housing 210, a memory 270 coupled to the housing 210, an antenna 280 coupled to the housing 210 and the transceiver 250, and a removable subscriber module 285 coupled to the controller 220.

As shown in FIG. 2, the device 200 further includes a display module 290 configured to manage, operate and customize the display operations. The display module 290 can include a monitor 292. The display module 290 can include a program that is loadable, upgradeable and customizable. This allows a user to enhance his or her device, as desired, by for example, downloading a software program, adjusting a setting and inputting information in a profile, for example. Advantageously, in one use case, a user can load an application through a USB connection, for example, or download a program to load on the device 210. Similarly, upgrades and customizations can be loaded in any customary way. In one embodiment, the display module 290 can monitor user activity via monitor 292 and customize the display, in unique desired ways, to make the electronic device look or function a certain way. In one embodiment, the module 290 can reside within in the controller 220, can reside within the memory 270, can be an autonomous module, can be software, can be implemented in hardware, or can be in any other format useful for a module on a wireless communication device 200.

The display 240 is a flexible display, as detailed herein, and can be a liquid crystal display (LCD), a light emitting diode (LED) display, a plasma display, a touch sensor display or any other means for displaying information. In one embodiment, the display 240 is a flexible display which can be folded into housing 210. The display technology can include flexible Organic LED display technology, LCD, EPD, electronic ink, Gyricon, and electrophoretic technology, for example.

The transceiver 250 may include a transmitter and/or a receiver. The audio input and output circuitry 230 can include a microphone, a speaker, a transducer, or any other audio input and output circuitry. The user interface 260 can include a keypad, buttons, a touch sensor or pad, a joystick, an additional display, or any other device useful for providing an interface between a user and an electronic device. The memory 270 may include a random access memory, a read only memory, an optical memory or any other memory that can be coupled to a wireless communication device.

In more detail, the device 200 shown in FIG. 2, can include: a housing 210; a controller 220 coupled to the housing 210, the controller 220 configured to control the operations of the device, and can provide ancillary computing operations which may be unrelated to wireless communications, such as audio or video processing, application processing and the like.

Figure 5:
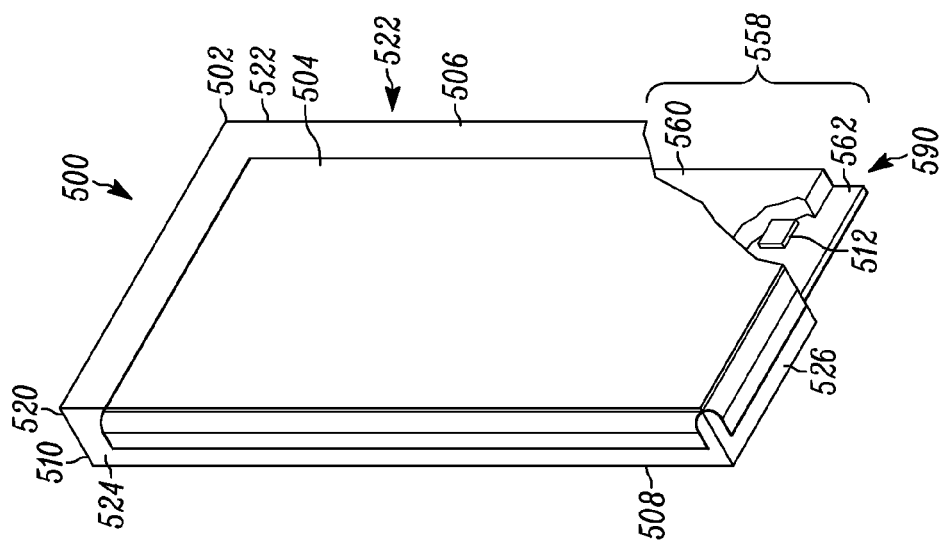
FIG. 5 is an exemplary electronic device with a housing and a flexible display with a cut-out feature in a folded mode, according to one embodiment.
Figure 4:
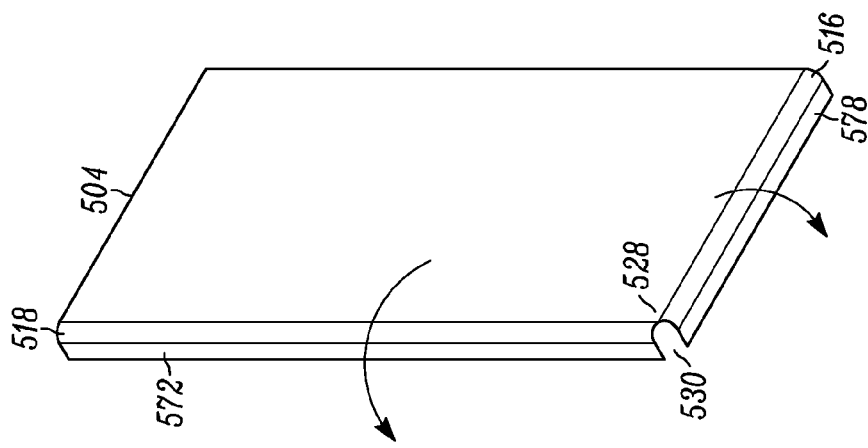
FIG. 4 is an exemplary flexible display with a cut-out feature in FIG. 3, but in a folded mode, according to one embodiment.
Figure 3:
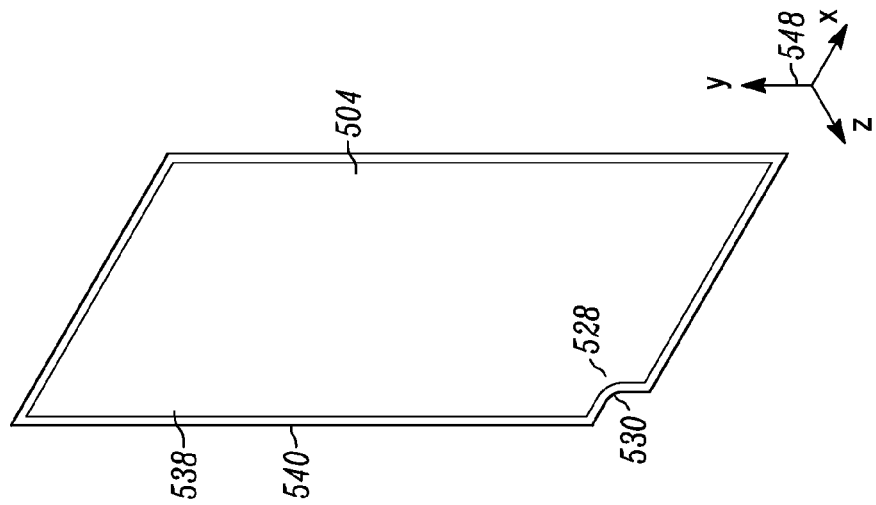
FIG. 3 is an exemplary flexible display with a cut-out feature in an unfolded mode, according to one embodiment.

FIG. 3 is an exemplary flexible display with a cut-out feature in an unfolded mode, FIG. 4 is flexible display in FIG. 3, in a folded mode and FIG. 5 is an exemplary electronic device 500 with a housing 502 and a flexible display 504.

As shown in FIG. 5, the electronic device 500 includes: a housing 502 including a front surface 506, a rear surface 508 and edge surface 510; a flexible display 504; a controller 512 coupled to the housing 502 and flexible display 504, the controller 512 configured to control the operations of an electronic device 500; and the flexible display 504 extending along the front surface 506 and along at least one edge surface 510, forming a fold area 514 where the front surface 506 and the at least one edge surface 510 meet, such that the flexible display 504 includes multiple display surfaces. Advantageously, this structure can provide an enhanced electronic device with multiple displays, multiple display active areas and/or user interfaces and is adapted for mass production.

In one embodiment as shown in FIG. 5, the housing 502 is generally rectangular and can have an opening on an edge, such as edge 520 or 522, configured to receive the flexible display 504 and component module 558 therein. Thus the housing includes a receptacle 590 complementarily configured and dimensioned to receive, the flexible display 504 and component module 558, to press against an interior surface of the housing 502. This can provide an enhanced electronic device which is adapted for mass production and is robust.

The edge surface 510 can include a north edge surface 520, east edge surface 522, west edge surface 524 and south edge surface 526, as detailed below. The folded area can include an X fold 516 and a Y fold 518.

In one embodiment, the flexible display 504 includes a first corner area 528 having a first cutout 530. Advantageously, the cutout is strategically placed to create non-connected edge(s), to facilitate and help form the fold area where the front surface and the at least one edge surface meet. The flexible display 504 can also include a second corner area 532 having a second cutout 534.

In one embodiment, the flexible display 504 has at least one curved cutout 530 at corner area 528, to create a non-connected area, to enhance and simplify the placement of the flexible display 504 in the housing 502. Thus, the flexible display 504 can be bent along at least two adjacent edges along X fold 516 and Y fold 518, as shown in FIG. 4, and can be separated by the first cutout 530. In this embodiment, three display areas are possible, for example, on front surface 506, on west edge surface 524 and south edge surface 526, and are define or separated by the X fold 516 and Y fold 518. In one use case, the electronic device can include a wireless communication device, such as a mobile phone, with a flexible display providing three adjacent viewing surfaces.

Figure 7:
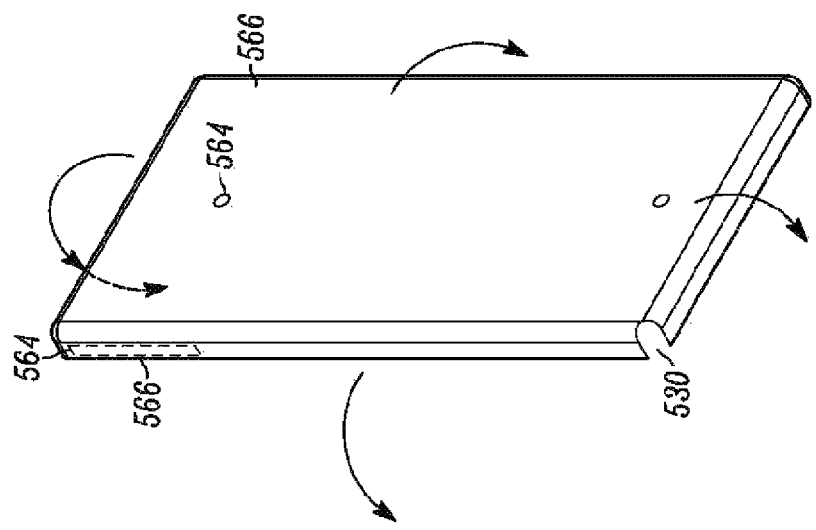
FIG. 7 is an exemplary flexible display with cut-out features in FIG. 6, but in a folded mode, according to one embodiment.
Figure 6:
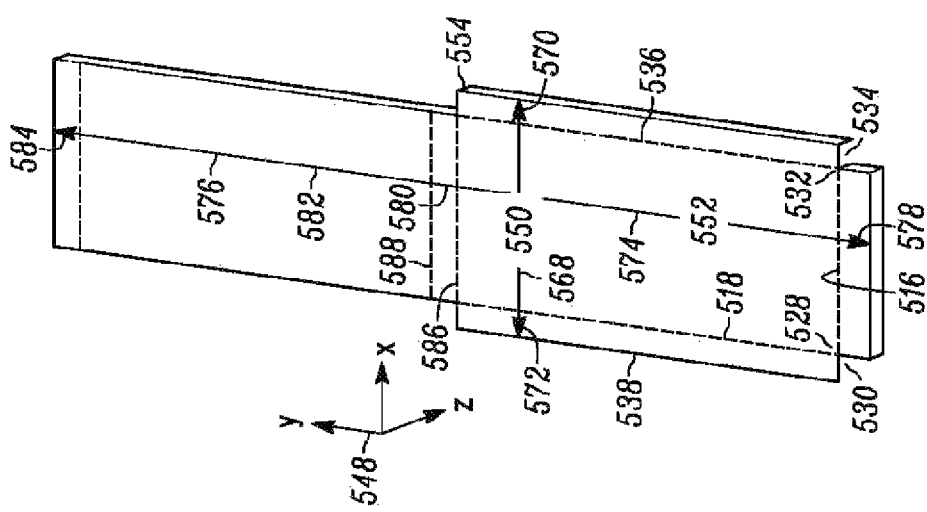
FIG. 6 is an exemplary flexible display with a cut-out feature in an unfolded mode, according to another embodiment.

In another embodiment, as shown in FIGS. 6 and 7, the flexible display 504 with first and second cutouts 530 and 534, can include multiple bend radii and allow the flexible display 504 to be wrapped along the front surface 506, east, west and south edges 522, 524 and 526, as desired, to provide four views on various surfaces. The four displays can be separated by X fold 516, Y fold 518 and second Y fold 536. Referring to FIG. 3, the flexible display 504 can includes an outer periphery 538 including a sealed edge 540. The outer periphery 538 and a sealed edge 540 can be used as a conduit for wires and reinforcement, for enhanced drop resistance.

In one embodiment, the multi-sided display surfaces can be controlled as to personalize and operate different areas independently depending on usage. For example, based on the orientation of an electronic device, such as a phone, a surface or region of a surface would display information that would make it visible while not making other surfaces visible. More specifically, one could place the phone on a table not worried about orienting it in a specific orientation, and the phone would display a clock in a reduced area. Another application could entail gaming and other multi-user scenarios. A first user would see information related to the first user and the other user(s) would access information pertinent to them.

As shown in FIG. 5, the housing 502 is configured to receive the flexible display 504. This configuration can provide an electronic device that is portable, robust, good looking and useful.

The housing 502 includes a width 542 along an x-axis of compass 548, a length 544 along a y-axis and a depth 566 along a z-axis and the flexible display 504 includes an X dimension 550 along an x-axis, a Y dimension 552 along a y-axis and a Z dimension 554 along a z-axis, the width 542 of the housing 502 is less than the X dimension 550 of the flexible display 504 and the length 544 of the housing is less than the Y dimension 552 of the flexible display 504. This structure provides a secure at-rest fit and wrap-around shape, such that the flexible display 504 will press against and be adjacent to an interior surface 556 of the housing 502. This structure also provides enhanced interconnection and integration of the housing 502 with the flexible display 504 and ease of assembly.

In one embodiment, the housing 502 includes a width 542 along an x-axis, a length 544 along a y-axis and a depth 546 along a z-axis and a component module 558 including a battery 560 and a circuit board 562 with the controller 220, the component module 558 being dimensioned to cause the flexible display 504 to press against, tightly fit and be adjacent to an interior surface 556 of the housing 502. This embodiment provides a modular, durable and robust design and construction, with the flexible display 504 being positioned in a desired way.

In one embodiment, the housing 502 includes a width 542 along an x-axis, a length 544 along a y-axis and a depth 546 along a z-axis and the flexible display 504 includes an X dimension 550 along an x-axis, a Y dimension 552 along a y-axis and a Z dimension 554 along a z-axis, the width 542 of the housing 502 is less than the X dimension 550 of the flexible display 504 and the length 544 of the housing 502 is less than the Y dimension 552 of the flexible display 504 and a component module 558 includes a battery 560 and a circuit board 562 with the controller 220, the component module 558 is dimensioned to cause the flexible display 504 to press against an interior surface 556 of the front surface 506 and an edge, such as west and south edge surfaces 524 and 526 of the housing 502. This embodiment can provide three display surfaces and provide a robust design that can be assembled in a consistent and reliable way.

Figure 8:
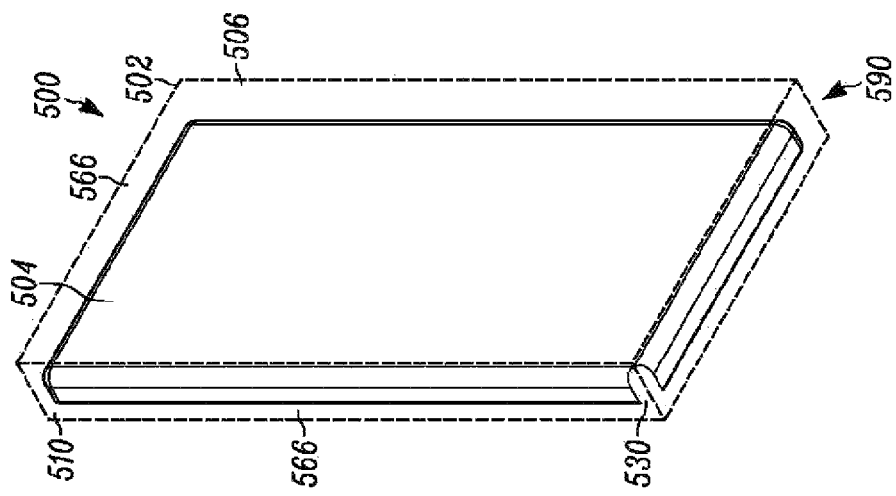
FIG. 8 is an exemplary electronic device with a housing 502 with a partial cut away view showing a component module 558 and a flexible display 504 with cut-out features in a folded mode, according to one embodiment.

In more detail, as shown in FIGS. 6, 7 and 8, the housing 502 can include front surface 506, rear surface 508 and north, east, west and south edge surfaces 520, 522, 524 and 526. The flexible display 504 has X dimension 550 with a central X region 568, east X region 570 and west X region 572. In this case, the east X region 570 is adjacent to the interior 556 of east edge surface 522 of the housing 502 the west X region 572 is adjacent to the interior 556 of west edge surface 524 of the housing 502.

Likewise, the Y dimension 552 includes a central Y region 578, a north Y region 576 and south Y region 578. The north Y region 576 can include sub-regions 580, 582 and 584. In one embodiment, the flexible display 504 can extend in length, to touch some, most or all of the interior 556 of the rear surface 508 of the housing 502.

As best shown in FIG. 6, the flexible display 504 includes first X fold 516, second X fold 586 and third X fold 588 and first Y fold 518 and second Y fold 536, which help to facilitate placement of the flexible display 504 into the receptacle 590 of the housing 502.

In one use case, the housing 502 can have strategically positioned openings 564 configured to allow: placement for speakers and microphones; or viewing of the flexible display 504, at desired locations. This can be advantageous for touch screen flexible displays, for example. Alternatively, the housing 502 can have strategically positioned transparent areas 566 to allow viewing of the flexible display 504 at desired locations. The transparent areas 566 can protect a touch screen display, for example. The housing 502 could also use one or both embodiments, depending on the use case.

The geometry of the housing 502 can vary. For example, the housing is generally rectangular with and open top or side, and is complementarily configured to receive the flexible display 504 with the component module 558. In one embodiment, the front surface 506 is curved or convex, along a length along a y-axis. In this use case, the electronic device is a phone and the curved construction can provide an enhanced user feel around a user's face for voice calling. Likewise, the edge surface 510 can be at least partially curved or convex, along a depth or z-axis of the housing 502. Often users prefer curved edge surfaces 510 for an enhanced look and feel. In a preferred embodiment, the flexible display 504 includes a touch sensor. In such embodiment, a touch sensor provides a user interface on multiple surfaces, as desired.

As shown in FIG. 2, the display module 290 can include a program that is loadable, upgradeable and customizable. This allows a user to enhance his or her device, as desired, by for example, downloading a software program, adjusting a setting and inputting information in a profile, for example. Advantageously, in one use case, a user can load an application through a USB connection, for example, or download a program to load on the device 210. Similarly, upgrades and customizations can be loaded in any customary way. In one embodiment, the display module 290 can monitor user activity via monitor 292 and customize the display, in unique desired ways to make the electronic device look a certain way.

The device 120 has many use cases, including but not limited to: consumer use in gaming, newspapers, ebooks, electronic poster boards and the like; use in wireless communication devices, such as wireless phones and tablets having three to six display surfaces, as desired; and enterprise use and service applications and the like. The device 120 and 200 and method detailed, are adapted to being implemented on a programmed processor. However, the controllers, flowcharts, and modules may also be implemented on a general purpose or special purpose computer, a programmed microprocessor or microcontroller and peripheral integrated circuit elements, an integrated circuit, a hardware electronic or logic circuit such as a discrete element circuit, a programmable logic device, or the like. In general, any device on which resides a finite state machine capable of implementing the flowcharts shown in the figures may be used to implement the processor functions of this disclosure.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, the preferred embodiments of the disclosure as set forth herein are intended to be illustrative, not limiting. Various changes may be made without departing from the spirit and scope of the disclosure. In this document, relational terms such as "first," "second," and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising."

We claim:

1. An electronic device, comprising:
   a housing including a front surface, a rear surface, a west edge surface, and a south edge surface;
   a flexible display, having a front surface, a west region defined by a first fold along a y-axis, and a south region defined by a second fold along an x-axis, the flexible display having a curved cutout creating a non-connected area at a corner area between the west region and the south region when the flexible display is folded along the first fold and the second fold;
   a controller coupled to the housing and flexible display, the controller, in operation, controlling functions of the electronic device; and the front surface of the flexible display extending along the front surface of the housing, the west region of the flexible display extending along the west edge surface of the housing, and the south region of the flexible display extending along the south edge surface of the housing, such that the flexible display includes at least three display surfaces.

2. The electronic device of claim 1, wherein the flexible display includes an outer periphery including a sealed edge.

3. The electronic device of claim 1, wherein the housing is configured to receive the flexible display.

4. The electronic device of claim 1, wherein the housing includes a width along an x-axis, a length along a y-axis and a depth along a z-axis and the flexible display includes an X dimension along the x-axis and a Y dimension along the y-axis, the width of the housing is less than the X dimension of the flexible display and the length of the housing is less than the Y dimension of the flexible display.

5. The electronic device of claim 1, wherein the housing includes a width along an x-axis, a length along a y-axis and a depth along a z-axis and a component module including a battery and a circuit board with the controller, the component module being dimensioned to cause the flexible display to press against an interior surface of the housing.

6. The electronic device of claim 1, wherein the housing includes a width along an x-axis, a length along a y-axis and a depth along a z-axis and the flexible display includes an X dimension along the x-axis, a Y dimension along the y-axis and a Z dimension along a z-axis, the width of the housing is less than the X dimension of the flexible display and the length of the housing is less than the Y dimension of the flexible display and a component module including a battery and a circuit board with the controller, the component module being dimensioned to cause the flexible display to press against an interior surface of the front surface and edge surface of the housing.

7. The electronic device of claim 1, wherein the housing has openings configured to allow viewing of the flexible display.

8. The electronic device of claim 1, wherein the housing has transparent areas to allow viewing of the flexible display.

9. The electronic device of claim 1, wherein the housing includes a width along an x-axis, a length along a y-axis and a depth along a z-axis and the flexible display includes an X dimension and a Y dimension, the width of the housing is less than the X dimension of the flexible display and the length of the housing is less than the Y dimension of the flexible display, the X dimension and the Y dimension the of the flexible display are configured to press against an interior surface of the front surface and an edge surface of the housing.

10. The electronic device of claim 1, wherein the housing includes a width along an x-axis, a length along a y-axis and a depth along a z-axis and the flexible display includes an X dimension and a Y dimension, the width of the housing is less than the X dimension of the flexible display and the length of the housing is less than the Y dimension of the flexible display, the X dimension and the Y dimension of the flexible display are configured to press against an interior surface of the front surface and an edge surface of the housing.

11. The electronic device of claim 1, wherein the front surface of the housing is curved along a length along a y-axis.

12. The electronic device of claim 1, wherein the edge surface is at least partially curved along a depth of the housing along a z-axis.

13. The electronic device of claim 1, wherein the flexible display includes a touch screen.

14. The electronic device of claim 1, wherein:
the flexible display is generally rectangular.

15. The electronic device of claim 14, wherein the housing further includes a component module including a battery and a circuit board with the controller, the component module being dimensioned to cause the flexible display to press against an interior surface of the housing.

16. The electronic device of claim 14, wherein the housing is transparent to allow viewing of the flexible display.

17. The electronic device of claim 14, wherein the flexible display includes a touch screen.

18. The electronic device of claim 14, wherein the housing is generally rectangular including an opening configured to receive the flexible display and component module including a battery and a circuit board with the controller, the component module being dimensioned to cause the flexible display to press against an interior surface of the housing.

19. The electronic device of claim 14, wherein the housing is substantially transparent.

* * * * *